United States Patent
Choi et al.

(10) Patent No.: US 9,214,564 B2
(45) Date of Patent: Dec. 15, 2015

(54) THIN FILM TRANSISTOR AND ORGANIC LIGHT EMITTING DIODE DISPLAY HAVING MINIMAL OVERLAP OF GATE ELECTRODE BY SOURCE AND DRAIN ELECTRODES

(71) Applicant: SAMSUNG DISPLAY CO., LTD., Yongin, Gyeonggo-do (KR)

(72) Inventors: Chaun-Gi Choi, Yongin (KR); Sun-Kwang Kim, Yongin (KR); Hui-Won Yang, Yongin (KR); Sang-Il Park, Yongin (KR)

(73) Assignee: SAMSUNG DISPLAY CO., LTD, Yongin, Gyeonggi-Do (KR)

( * ) Notice: Subject to any disclaimer, the term of this patent is extended or adjusted under 35 U.S.C. 154(b) by 0 days.

(21) Appl. No.: 14/096,939

(22) Filed: Dec. 4, 2013

(65) Prior Publication Data
US 2015/0001484 A1  Jan. 1, 2015

(30) Foreign Application Priority Data
Jun. 28, 2013 (KR) .................. 10-2013-0075572

(51) Int. Cl.
| H01L 29/10 | (2006.01) |
| --- | --- |
| H01L 29/12 | (2006.01) |
| H01L 29/08 | (2006.01) |
| H01L 35/24 | (2006.01) |
| H01L 51/00 | (2006.01) |
| H01J 1/62 | (2006.01) |
| H01J 63/04 | (2006.01) |
| H01L 29/786 | (2006.01) |
| H01L 27/32 | (2006.01) |
| H01L 29/417 | (2006.01) |
| H01L 21/00 | (2006.01) |
| H01L 21/84 | (2006.01) |

(52) U.S. Cl.
CPC ........ *H01L 29/7869* (2013.01); *H01L 27/3244* (2013.01); *H01L 29/41733* (2013.01); *H01L 27/3262* (2013.01)

(58) Field of Classification Search
None
See application file for complete search history.

(56) References Cited

U.S. PATENT DOCUMENTS

| 2011/0031491 A1* | 2/2011 | Yamazaki et al. ............... 257/43 |
| 2011/0037068 A1* | 2/2011 | Yamazaki et al. ............... 257/43 |
| 2011/0114914 A1* | 5/2011 | Numata et al. .................... 257/9 |
| 2013/0240846 A1* | 9/2013 | Im et al. ......................... 257/40 |

FOREIGN PATENT DOCUMENTS

| KR | 10-1073543 | 3/2011 |
| KR | 10-1050466 | 7/2011 |
| KR | 10-2011-0101771 | 9/2011 |

OTHER PUBLICATIONS

Definition of Align. (n.d.) The American Heritage® Dictionary of the English Language, Fourth Edition. (2003). Retrieved Dec. 11, 2014 from http://www.thefreedictionary.com/align.*

* cited by examiner

*Primary Examiner* — Michael Jung
(74) *Attorney, Agent, or Firm* — F. Chau & Associates, LLC

(57) ABSTRACT

A thin film transistor (TFT) includes a gate electrode disposed on a substrate. An oxide semiconductor layer is disposed on the gate electrode. An insulation layer is disposed on the oxide semiconductor layer. The insulation layer includes a first contact hole that exposes a first part of the oxide semiconductor layer corresponding to a first end of the gate electrode and a second contact hole that exposes a second part of the oxide semiconductor layer corresponding to an opposite end of the gate electrode. A source electrode is disposed on the insulation layer and contacts the first part of the oxide semiconductor layer through the first contact hole. A drain electrode is disposed on the insulation layer and contacts the second part of the oxide semiconductor layer through the second contact hole.

18 Claims, 5 Drawing Sheets

THIN FILM TRANSISTOR AND ORGANIC LIGHT EMITTING DIODE DISPLAY HAVING MINIMAL OVERLAP OF GATE ELECTRODE BY SOURCE AND DRAIN ELECTRODES

CROSS REFERENCE TO RELATED APPLICATIONS

This application claims priority to and the benefit of Korean Patent Application No. 10-2013-0075572, filed in the Korean Intellectual Property Office on Jun. 28, 2013, the entire contents of which are herein incorporated by reference.

TECHNICAL FIELD

The described technology relates generally to a thin film transistor (TFT), and more particularly, to a thin film transistor (TFT) and an organic light emitting diode (OLED) display including the same.

DISCUSSION OF THE RELATED ART

An organic light emitting diode (OLED) display is a type of display device for displaying an image.

Since the organic light emitting diode (OLED) display has a self-light emitting (self-luminance) characteristic and does not need additional light source, unlike a liquid crystal display (LCD), the thickness and weight of the organic light emitting diode (OLED) display may be substantially less than that of the LCD. The organic light emitting diode (OLED) display has low power consumption, high luminance, and high response speed.

In general, the organic light emitting diode (OLED) display includes a plurality of thin film transistors (TFT) and organic light emitting diodes. Each thin film transistor (TFT) includes a gate electrode, a gate insulation layer disposed on the gate electrode, an oxide semiconductor layer disposed on the gate insulation layer, a contact insulation layer including contact holes and disposed on the oxide semiconductor layer, and a source electrode and a drain electrode disposed on the contact insulation layer contacting the oxide semiconductor layer through the contact holes.

In the thin film transistor (TFT) of organic light emitting diode (OLED) displays, since the source electrode and the drain electrode cover the contact holes to contact the oxide semiconductor layer so that large parts of the source electrode and the drain electrode overlap the gate electrode, a signal that passes through the gate electrode is delayed by parasitic capacity generated in the gate insulation layer corresponding the overlapping parts. The delayed signal may lead to insufficient charging of storage capacitors of the OLED display and this may lead to reduced image quality.

SUMMARY

Exemplary embodiments of the present invention provided a thin film transistor (TFT) capable of minimizing signal delay caused by parasitic capacity and an organic light emitting diode (OLED) display including the same.

According to some exemplary embodiments of the present invention, there is provided a thin film transistor (TFT) including a first gate electrode disposed on a substrate. A first oxide semiconductor layer is disposed on the first gate electrode. An insulation layer is disposed on the first oxide semiconductor layer and includes a first contact hole that exposes a first part of the first oxide semiconductor layer corresponding to a first end of the first gate electrode and a second contact hole that exposes a second part of the first oxide semiconductor layer corresponding to the second end of the first gate electrode. A first source electrode is disposed on the insulation layer and contacts a part of the first part of the first oxide semiconductor layer through the first contact hole. A first drain electrode is disposed on the insulation layer and contacts a part of the second part of the first oxide semiconductor layer through the second contact hole.

A remaining part of the first part of the first oxide semiconductor layer may be exposed by the first contact hole.

A remaining part of the second part of the first oxide semiconductor layer may be exposed by the second contact hole.

An organic light emitting diode (OLED) display includes a thin film transistor (TFT), a driving thin film transistor (TFT) including a second gate electrode connected to the first drain electrode of the thin film transistor (TFT), and an organic light emitting diode (OLED) connected to the driving thin film transistor (TFT).

The driving thin film transistor (TFT) may further include the second gate electrode disposed on the substrate and a second oxide semiconductor layer disposed on the second gate electrode. The insulation layer may further include a third contact hole that exposes a third part of the second oxide semiconductor layer corresponding to a first end of the second gate electrode and a fourth contact hole that exposes a fourth part of the second oxide semiconductor layer corresponding to a second (opposite) end of the second gate electrode. The driving thin film transistor (TFT) may further include a second source electrode disposed on the insulation layer and contacting the third part of the second oxide semiconductor layer through the third contact hole and a second drain electrode disposed on the insulation layer and contacting the fourth part of the second oxide semiconductor layer through the fourth contact hole.

The second source electrode may cover the third contact hole.

The second drain electrode may cover the fourth contact hole.

A first length between the first contact hole and the second contact hole may be smaller than a second length between the third contact hole and the fourth contact hole.

The second drain electrode may be connected to the organic light emitting diode (OLED).

A thin film transistor (TFT) includes a gate electrode disposed on a substrate. An oxide semiconductor layer is disposed on the gate electrode. An insulation layer is disposed on the oxide semiconductor layer and includes a contact hole that exposes a partial surface of the oxide semiconductor layer. A source electrode and a drain electrode are disposed on the insulation layer and contact a part of the partial surface of the oxide semiconductor layer through the contact hole.

A remaining part of the partial surface of the oxide semiconductor layer may be exposed by the contact hole.

An organic light emitting diode (OLED) including a thin film transistor (TFT), the TFT includes a gate electrode disposed on a substrate. An oxide semiconductor layer is disposed on the gate electrode. An insulation layer is disposed on the oxide semiconductor layer. The insulation layer includes a first contact hole that exposes a first part of the oxide semiconductor layer and a second contact hole that exposes a second part of the oxide semiconductor layer. A source electrode is disposed on the insulation layer. The source electrode contacts the first part of the first oxide semiconductor layer through the first contact hole. A drain electrode is disposed on the insulation layer. The drain electrode contacts the second part of the oxide semiconductor layer through the second contact hole.

The first part of the oxide semiconductor layer may be exposed by the first contact hole. The second part of the oxide semiconductor layer may be exposed by the second contact hole.

The OLED may further include a driving TFT. The driving TFT may include a driving TFT gate electrode connected to the drain electrode of the TFT. The driving TFT gate electrode may be disposed on the substrate, and a driving TFT oxide semiconductor layer may be disposed on the driving TFT gate electrode.

The insulation layer may further include a third contact hole that exposes the driving TFT oxide semiconductor layer and a fourth contact hole that exposes the driving TFT oxide semiconductor layer.

The driving TFT may further include a driving TFT source electrode disposed on the insulation layer and contacting the driving TFT oxide semiconductor layer through the third contact hole. A driving TFT drain electrode may be disposed on the insulation layer and may contact the driving TFT oxide semiconductor layer thought the fourth contact hole.

The driving TFT source electrode may cover the third contact hole and the driving TFT drain electrode may cover the fourth contact hole.

A first length between the first contact hole and the second contact hole may be smaller than a second length between the third contact hole and the fourth contact hole.

According to the exemplary embodiment, the thin film transistor (TFT) capable of minimizing signal delay caused by parasitic capacity and the organic light emitting diode (OLED) display including the same are provided.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
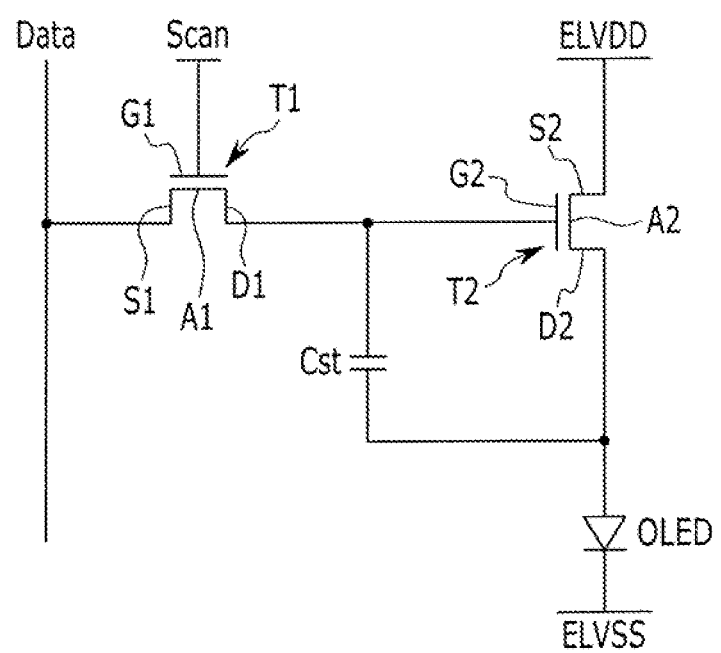
FIG. 1 is a circuit diagram illustrating an organic light emitting diode (OLED) display according to an exemplary embodiment of the present invention.

Exemplary embodiments of the present invention will be described more fully hereinafter with reference to the accompanying drawings. As those skilled in the art would realize, the described embodiments may be modified in various different ways, all without departing from the spirit or scope of the present invention.

In order to clearly describe the exemplary embodiments, parts that are not related to description may be omitted from the description and the same reference numerals may designate the same or similar constituent elements throughout the specification.

In the drawings, the thickness of layers, films, panels, regions, etc., may be exaggerated or minimized for clarity. In the drawings, for better understanding and ease of description, thicknesses of partial layers and regions may be exaggerated or minimized.

In the accompanying drawings, an active matrix (AM) type organic light emitting diode (OLED) display of a 2Tr-1Cap structure in which one pixel includes two thin film transistors (TFT) and one capacitor is illustrated as an example. However, the present invention is not limited thereto. Therefore, in the organic light emitting diode (OLED) display, each pixel may include three or more thin film transistors (TFT) and two or more capacitors and an additional wire may be further formed so that the organic light emitting diode (OLED) display may have various structures. Here, the pixel is described as a minimum unit for displaying a portion of an image and the organic light emitting diode (OLED) display displays an image by a plurality of pixels.

Hereinafter, an organic light emitting diode (OLED) display according to an exemplary embodiment will be described with reference to FIGS. 1 to 5. As used herein, a switching thin film transistor (TFT) may mean a thin film transistor (TFT).

FIG. 1 is a circuit diagram illustrating an organic light emitting diode (OLED) display according to an exemplary embodiment of the present invention.

As illustrated in FIG. 1, an organic light emitting diode (OLED) display according to an exemplary embodiment of the present invention generates light using organic light emitting diodes (OLED). An image is displayed with the generated light. The OLED display includes scan lines Scan, data lines Data, driving power lines ELVDD, a common power source ELVSS, switching thin film transistors (TFT) T1, driving thin film transistors (TFT) T2, capacitors Cst, and organic light emitting diodes (OLED) OLED.

The scan lines Scan, the data lines Data, the driving power lines ELVDD, and the common power source ELVSS are lines through which scan signals, data signals, driving signals, and a common signal pass, respectively, and may have various structures.

Figure 2:
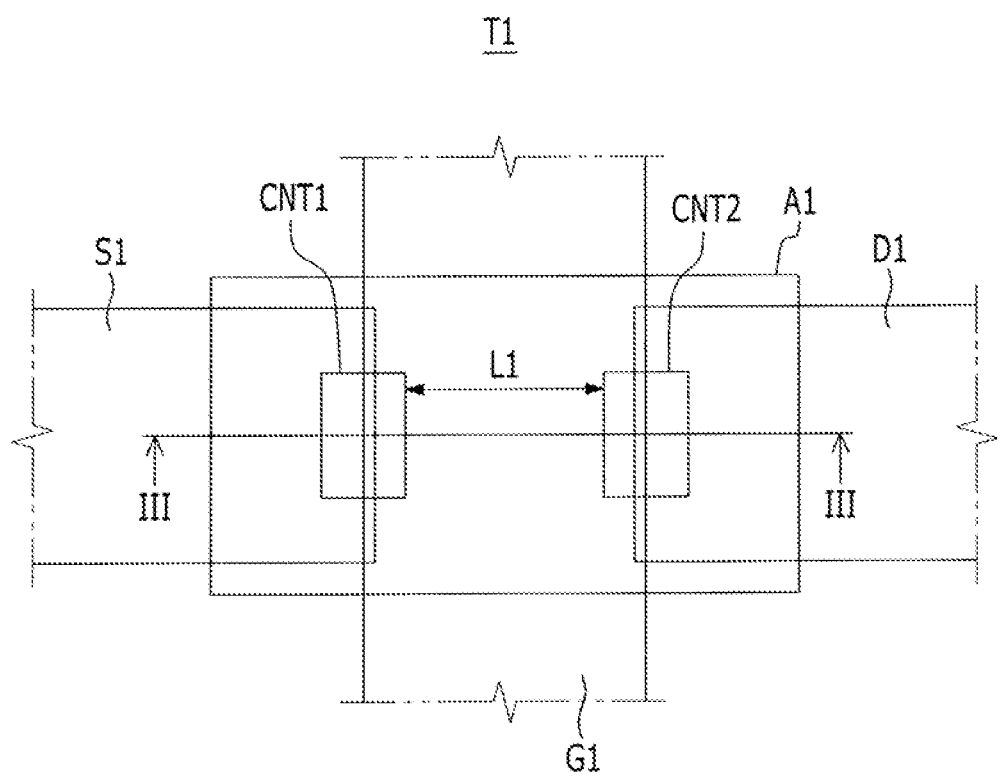
FIG. 2 is a top plan view illustrating the switching thin film transistor (TFT) illustrated in FIG. 1.
Figure 3:
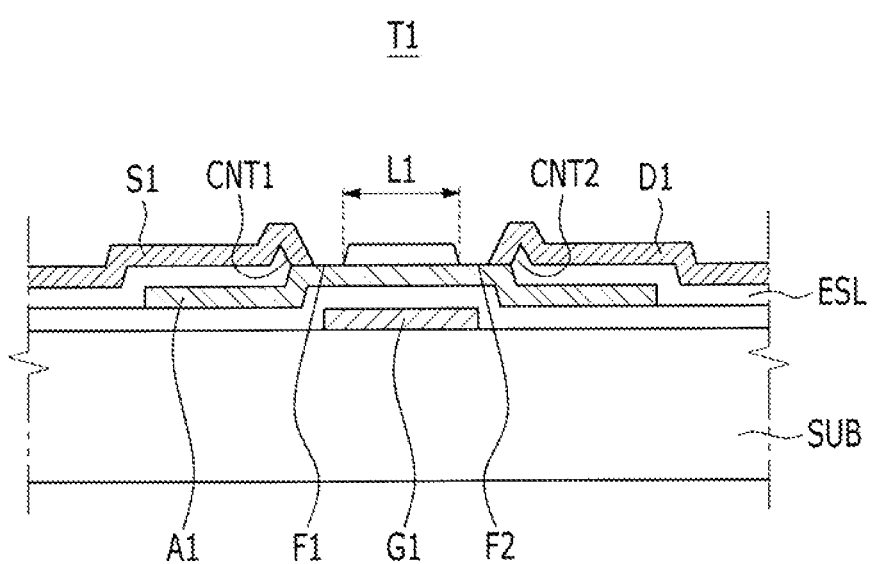
FIG. 3 is a cross-sectional view taken along the line of FIG. 2.

FIG. 2 is a top plan view illustrating the switching thin film transistor (TFT) illustrated in FIG. 1. FIG. 3 is a cross-sectional view taken along the line of FIG. 2.

As illustrated in FIGS. 1 to 3, turn-on and turn-off of the switching thin film transistor (TFT) T1 are controlled by the scan signal that passes through the scan line Scan. The switching thin film transistor (TFT) T1 is connected between the data line Data and a gate electrode of the driving thin film transistor (TFT) T2. The switching thin film transistor (TFT) T1 includes a first gate electrode G1, a first oxide semiconductor layer A1, an insulation layer ESL, a first source electrode S1, and a first drain electrode D1.

The first gate electrode G1 is disposed on a substrate SUB and is connected to the scan line Scan.

The first oxide semiconductor layer A1 is disposed on the first gate electrode G1 with a gate insulation layer interposed. A first part F1 of the first oxide semiconductor layer A1 is exposed by a first contact hole CNT1 of the insulation layer ESL to correspond to a first end of the first gate electrode G1. A second part F2 of the first oxide semiconductor layer A1 is exposed by a second contact hole CNT2 of the insulation layer ESL to correspond to the second end of the first gate electrode G1. The first source electrode S1 and the first drain electrode D1 contact the first part F1 and the second part F2 of the first oxide semiconductor layer A1, respectively.

The first oxide semiconductor layer A1 includes oxide semiconductor. The oxide semiconductor may include at least one oxide based on titanium (Ti), hafnium (Hf), zirconium (Zr), aluminum (Al), tantalum (Ta), germanium (Ge), zinc (Zn), gallium (Ga), tin (Sn), or indium (In). The oxide semiconductor may include at least one composite oxides of titanium (Ti), hafnium (Hf), zirconium (Zr), aluminum (Al), tantalum (Ta), germanium (Ge), zinc (Zn), gallium (Ga), tin (Sn), or indium (In). For example, the oxide semiconductor may include zinc oxide (ZnO), indium-gallium-zinc oxide ($InGaZnO_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O).

An additional protective layer may be formed on the first oxide semiconductor layer A1 to protect the oxide semiconductor as it is exposed to high temperature and may be otherwise vulnerable to an external environment.

The insulation layer ESL is disposed on the first oxide semiconductor layer A1 and includes the first contact hole CNT1 that exposes the first part F1 of the first oxide semiconductor layer A1 and the second contact hole CNT2 that exposes the second part F2 of the first oxide semiconductor layer A1. For example, the insulation layer ESL includes the first contact hole CNT1 and the second contact hole CNT2 that expose partial surfaces of the first oxide semiconductor layer A1. The insulation layer ESL may include an inorganic material such as silicon nitride or silicon oxide.

The first source electrode S1 is disposed on the insulation layer ESL and is connected to the data line Data. The first source electrode S1 contacts a part of the first part F1 of the first oxide semiconductor layer A1 through the first contact hole CNT1. The first source electrode S1 contacts a part of the first part F1 of the first oxide semiconductor layer A1 to cover a part of the first part F1 of the first oxide semiconductor layer A1 so that a remaining part of the first part F1 of the first oxide semiconductor layer A1 is exposed by the first contact hole CNT1.

The first drain electrode D1 is separated from the first source electrode S1 with the first gate electrode G1 interposed therebetween. The first hate electrode G1 is connected to the capacitor Cst and the gate electrode of the driving thin film transistor (TFT) T2. The first drain electrode D1 contacts a part of the second part F2 of the first oxide semiconductor layer A1 through the second contact hole CNT2. The first drain electrode D1 contacts a part of the second part F2 of the first oxide semiconductor layer A1 to cover a part of the second part F2 of the first oxide semiconductor layer A1 so that a remaining part of the second part F2 of the first oxide semiconductor layer A1 is exposed by the second contact hole CNT2.

For example, the first source electrode S1 and the first drain electrode D1 are disposed on the insulation layer ESL to contact parts of the partial surfaces of the first oxide semiconductor layer A1 through the first contact hole CNT1 and the second contact hole CNT2, respectively, so that remaining parts of the partial surfaces of the first oxide semiconductor layer A1 are exposed by the first contact hole CNT1 and the second contact hole CNT2.

As described above, in the switching thin film transistor (TFT) T1 of the organic light emitting diode (OLED) display according to an exemplary embodiment of the present invention, since the first source electrode S1 and the first drain electrode D1 contact parts of the first part F1 and the second part F2 of the first oxide semiconductor layer A1 to cover only parts of the first part F1 and the second part F2 so that the first source electrode S1 and the first drain electrode D1 overlap the first gate electrode G1 by minimum areas, a delay of the scan signal that passes through the first gate electrode G1, which is caused by parasitic capacity generated in the gate insulation layer corresponding to the overlapping parts, may be minimized.

In the switching thin film transistor (TFT) T1 of the organic light emitting diode (OLED) display according to an exemplary embodiment of the present invention, since the first source electrode S1 and the first drain electrode D1 contact parts of the first part F1 and the second part F2 of the first oxide semiconductor layer A1 to cover only parts of the first part F1 and the second part F2, a first length L1 between the first contact hole CNT1 and the second contact hole CNT2 may be reduced in comparison with a structure in which the source electrode and the drain electrode cover the first contact hole CNT1 and the second contact hole CNT2, respectively, and are separated from each other by a predetermined distance in order to prevent a short circuit from being generated between the source electrode and the drain electrode. Therefore, a channel distance of the first oxide semiconductor layer A1 corresponding to the first length L1 is minimized so that the switching thin film transistor (TFT) T1 that moves the data signal from the first source electrode S1 to the first drain electrode D1 through the channel of the first oxide semiconductor layer A1 at high speed is provided.

Figure 4:
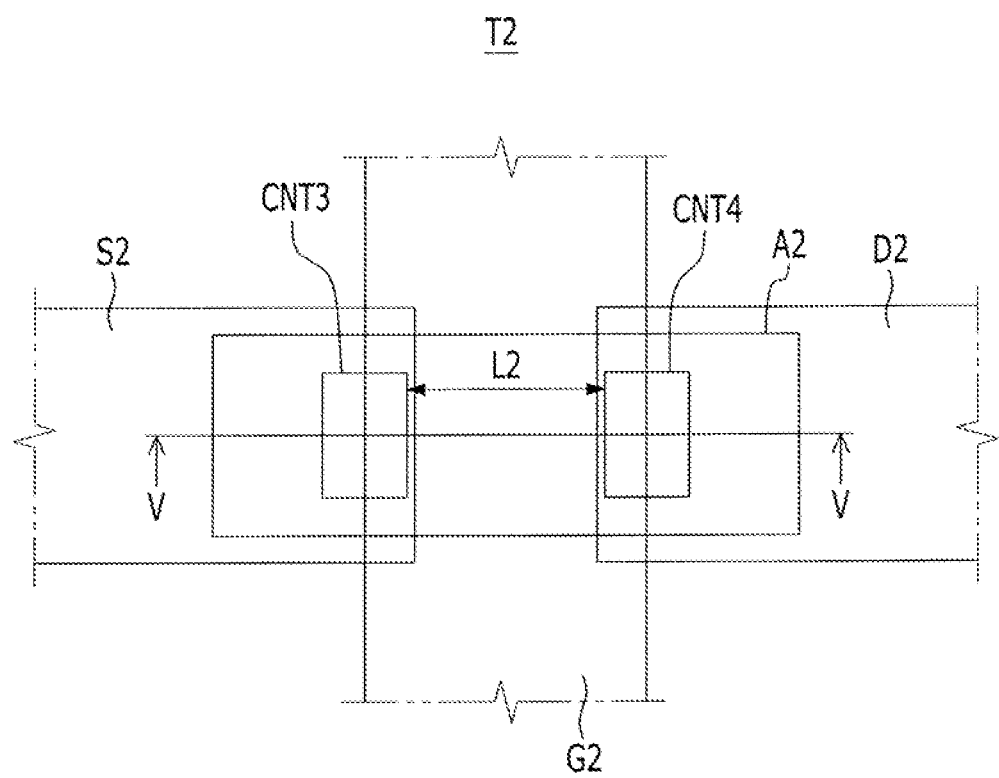
FIG. 4 is a top plan view illustrating the driving thin film transistor (TFT) illustrated in FIG. 1.
Figure 5:
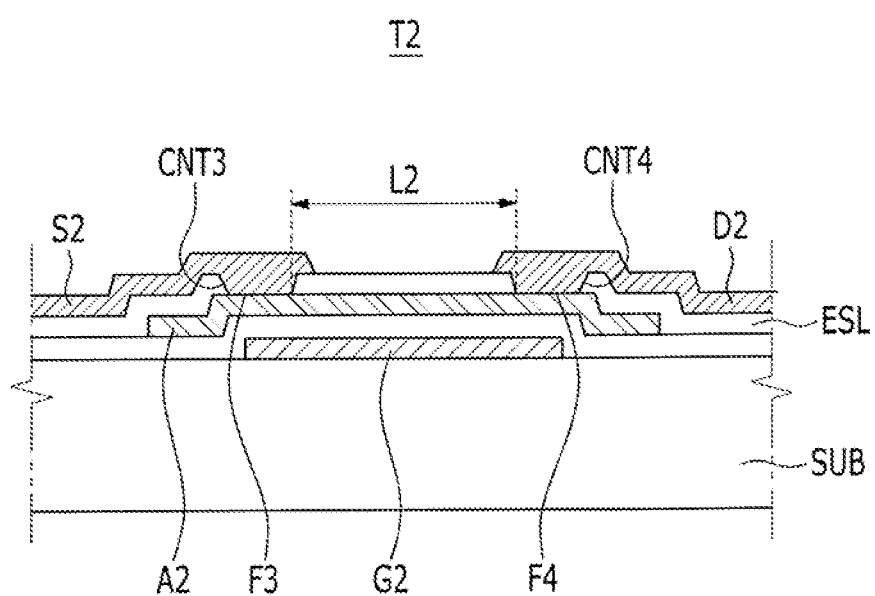
FIG. 5 is a cross-sectional view taken along the line V-V of FIG. 4.

FIG. 4 is a top plan view illustrating the driving thin film transistor (TFT) illustrated in FIG. 1. FIG. 5 is a cross-sectional view taken along the line V-V of FIG. 4.

As illustrated in FIGS. 1, 4, and 5, a turning-on and a turning-off of the driving thin film transistor (TFT) T2 are controlled by the data signal that passes through the switching thin film transistor (TFT) T1. The driving thin film transistor (TFT) is connected between the driving power line ELVDD and the organic light emitting diode OLED. The driving thin film transistor (TFT) T2 includes a second gate electrode G2, a second oxide semiconductor layer A2, an insulation layer ESL, a second source electrode S2, and a second drain electrode D2.

The second gate electrode G2 is disposed on the substrate SUB and is connected to the first drain electrode D1 of the switching thin film transistor (TFT) T1 and the capacitor Cst.

The second oxide semiconductor layer A2 is disposed on the second gate electrode G2 with the gate insulation layer interposed therebetween. A third part F3 of the second oxide semiconductor layer A2 is exposed by a third contact hole CNT3 of the insulation layer ESL to correspond to s first end of the second gate electrode G2 and a fourth part F4 of the second oxide semiconductor layer A2 is exposed by a fourth contact hole CNT4 of the insulation layer ESL to correspond to a first end of the second gate electrode G2. The second source electrode S2 and the second drain electrode D2 contact the third part F3 and the fourth part F4 of the second oxide semiconductor layer A2.

The second oxide semiconductor layer A2 includes oxide semiconductor and the oxide semiconductor may include an oxide based on titanium (Ti), hafnium (Hf), zirconium (Zr), aluminum (Al), tantalum (Ta), germanium (Ge), zinc (Zn), gallium (Ga), tin (Sn), or indium (In) and composite oxides of titanium (Ti), hafnium (Hf), zirconium (Zr), aluminum (Al), tantalum (Ta), germanium (Ge), zinc (Zn), gallium (Ga), tin (Sn), and indium (In), for example, zinc oxide (ZnO), indium-gallium-zinc oxide ($InGaZnO_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O).

An additional protective layer may be formed on the second oxide semiconductor layer A2 to protect the oxide semiconductor as it is exposed to high temperature and may otherwise be vulnerable to an external environment.

The insulation layer ESL is disposed on the second oxide semiconductor layer A2 and includes the third contact hole CNT3 that exposes the third part F3 of the second oxide semiconductor layer A2 and the fourth contact hole CNT4 that exposes the fourth part F4 of the second oxide semiconductor layer A2. The insulation layer ESL is an insulation layer included in the above-described switching thin film transistor (TFT) T1.

The second source electrode S2 is disposed on the insulation layer ESL and may be connected to the driving power line ELVDD. The second source electrode S2 contacts the third part F3 of the second oxide semiconductor layer A2 through the third contact hole CNT3. The second source electrode S2 covers the third contact hole CNT3 to contact the third part F3 of the second oxide semiconductor layer A2 through the third contact hole CNT3.

The second drain electrode D2 is separated from the second source electrode S2 with the second gate electrode G2 interposed therebetween. The second gate electrode may be connected to the organic light emitting diode (OLED). The second drain electrode D2 contacts the fourth part F4 of the second oxide semiconductor layer A2 through the fourth contact hole CNT4. The second drain electrode D2 covers the fourth contact hole CNT4 to contact the fourth part F4 of the second oxide semiconductor layer A2 through the fourth contact hole CNT4.

As described above, in the driving thin film transistor (TFT) T2 according to an exemplary embodiment of the present invention, the second source electrode S2 and the second drain electrode D2 cover the third contact hole CNT3 and the fourth contact hole CNT4, respectively, to contact the third part F3 and the fourth part F4 of the second oxide semiconductor layer A2, respectively, so that the second source electrode S2 and the second drain electrode D2 cover the exposed third and fourth parts F3 and F4 of the second oxide semiconductor layer A2, respectively. It is therefore possible to minimize defects caused by high temperature generated during manufacturing processes and a voltage that passes through the second gate electrode G2. For example, a high reliability driving thin film transistor (TFT) T2 is provided.

In the thin film transistor (TFT) T2 of the organic light emitting diode (OLED) display according to an exemplary embodiment of the present invention, since the second source electrode S2 and the second drain electrode D2 cover the third part F3 and the fourth part F4 of the second oxide semiconductor layer A2, respectively, a second length L2 between the third contact hole CNT3 and the fourth contact hole CNT4 is formed to be larger than the first length L1 between the first contact hole CNT1 and the second contact hole CNT2 of the above-described switching thin film transistor (TFT) T1. For example, the first length L1 between the first contact hole CNT1 and the second contact hole CNT2 of the above-described switching thin film transistor (TFT) T1 is formed to be smaller than the second length L2 between the third contact hole CNT3 and the fourth contact hole CNT4 of the driving thin film transistor (TFT) T2.

Referring to FIG. 1, the capacitor Cst is formed between the first drain electrode D1 of the switching thin film transistor (TFT) T1 and the second drain electrode D2 of the driving thin film transistor (TFT) T2.

The organic light emitting diode (OLED) is connected to the second drain electrode D2 of the driving thin film transistor (TFT) T2 and includes a first electrode that functions as a hole injection electrode and is an anode electrode connected to the second drain electrode D2 of the driving thin film transistor (TFT) T2. A second electrode functions as an electron injection electrode and is a cathode electrode connected to the common power source ELVSS. An organic light emitting layer is arranged between the first electrode and the second electrode.

When the switching thin film transistor (TFT) T1 is turned on by the scan signal that moves from the scan line Scan to the first gate electrode G1, the data signal that passes through the data line Data moves to one electrode of the capacitor Cst and the second gate electrode G2 of the driving thin film transistor (TFT) T2 through the switching thin film transistor (TFT) T1 to turn on the driving thin film transistor (TFT) T2. At this time, the driving signal that passes the driving power line ELVDD moves to the other electrode of the capacitor Cst through the driving thin film transistor (TFT) T2 to charge the capacitor Cst and moves to the organic light emitting diode (OLED) to let the organic light emitting diode (OLED) that receives the common signal from the common power source ELVSS emit light. Therefore, the organic light emitting diode (OLED) emits light for a predetermined time by charges charged in the capacitor Cst.

Arrangement of the above-described circuit is not limited to the above-provided technical details but may have various modifications.

As described above, in the organic light emitting diode (OLED) display according to an exemplary embodiment of the present invention, since the first source electrode S1 and the first drain electrode D1 of the switching thin film transistor (TFT) T1 that is one of a plurality of thin film transistors (TFT) contact parts of the first part F1 and the second part F2 of the first oxide semiconductor layer A1 to cover only parts of the first part F1 and the second part F2 of the first oxide semiconductor layer A1 so that the first source electrode S1 and the first drain electrode D1 overlap the first gate electrode G1 by minimum areas, it is possible to minimize delay of the scan signal that passes through the first gate electrode G1, which is caused by parasitic capacity generated in the gate insulation layer corresponding to the overlapping parts.

Therefore, display quality of the image displayed by the organic light emitting diode (OLED) display is increased.

In an organic light emitting diode (OLED) display according to an exemplary embodiment of the present invention, since the first source electrode S1 and the first drain electrode D1 of the switching thin film transistor (TFT) T1 that is one of the plurality of thin film transistors (TFT) contact parts of the first part F1 and the second part F2 of the first oxide semiconductor layer A1 to cover only parts of the first part F1 and the second part F2 of the first oxide semiconductor layer A1, it is possible to minimize the first length L1 between the first contact hole CNT1 and the second contact hole CNT2 in comparison with a structure in which the source electrode and the drain electrode cover the first contact hole CNT1 and the second contact hole CNT2, respectively, and are separated from each other by a predetermined distance in order to prevent short from being generated between the source electrode and the drain electrode. Therefore, in an organic light emitting diode (OLED) display according to an exemplary embodiment of the present invention, since the channel distance of the first oxide semiconductor layer A1 corresponding to the first length L1 of the switching thin film transistor (TFT) T1 is minimized so that the data signal may be moved from the first source electrode S1 to the first drain electrode D1 through the channel of the first oxide semiconductor layer A1 at high speed, it is possible to minimize delay of the data signal. For example, there is provided the organic light emitting diode (OLED) display in which display quality of an image is increased.

In an organic light emitting diode (OLED) display according to an exemplary embodiment of the present invention, since the second source electrode S2 and the second drain electrode D2 of the driving thin film transistor (TFT) T2 cover the third contact hole CNT3 and the fourth contact hole CNT4, respectively, to contact the third part F3 and the fourth part F4 of the second oxide semiconductor layer A2, respectively, so that the second source electrode S2 and the second drain electrode D2 cover the exposed third and fourth parts F3 and F4 of the second oxide semiconductor layer A2, respectively, it is possible to minimize defects caused by the high temperature generated during the manufacturing processes and the voltage that passes through the second gate electrode G2. For example, the organic light emitting diode (OLED) display including the high reliability driving thin film transistor (TFT) T2 is provided.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the disclosure.

What is claimed is:

1. A thin film transistor (TFT), comprising:
   a first gate electrode disposed on a substrate;
   a first oxide semiconductor layer disposed on the first gate electrode;
   an insulation layer disposed on the first oxide semiconductor layer, the insulation layer including a first contact hole that exposes a first part of the first oxide semiconductor layer corresponding to a first end edge of the first gate electrode and a second contact hole that exposes a second part of the first oxide semiconductor layer corresponding to a second end edge of the first gate electrode opposite to the first end edge of the first gate electrode;
   a first source electrode disposed on the insulation layer, the first source electrode contacting a part of the first part of the first oxide semiconductor layer through the first contact hole; and
   a first drain electrode disposed on the insulation layer, and the first drain electrode contacting a part of the second part of the first oxide semiconductor layer through the second contact hole,
   wherein the first contact hole of the insulation layer is disposed perpendicularly above the first end edge of the first gate electrode without the first source electrode making contact with a discrete portion of the insulation layer between the first contact hole and the second contact hole thereof, and the second contact hole of the insulation layer is disposed perpendicularly above the second end edge of the first gate electrode without the first drain electrode making contact with the discrete portion of the insulation layer between the first contact hole and the second contact hole thereof, and
   wherein the substrate is disposed horizontally and below the first gate electrode.

2. The thin film transistor (TFT) of claim 1, wherein a remaining part of the first part of the first oxide semiconductor layer is exposed by the first contact hole, and not covered by the first source electrode.

3. The thin film transistor (TFT) of claim 2, wherein a remaining part of the second part of the first oxide semiconductor layer is exposed by the second contact hole, and not covered by the first source electrode.

4. An organic light emitting diode (OLED) display, comprising:
   a thin film transistor (TFT) comprising:
      a first gate electrode disposed on a substrate;
      a first oxide semiconductor layer disposed on the first gate electrode;
      an insulation layer disposed on the first oxide semiconductor layer, the insulation layer including a first contact hole that exposes a first part of the first oxide semiconductor layer corresponding to a first end edge of the first gate electrode and a second contact hole that exposes a second part of the first oxide semiconductor layer corresponding to a second end edge of the first gate electrode opposite to the first end edge of the first gate electrode;
      a first source electrode disposed on the insulation layer, the first source electrode contacting a part of the first part of the first oxide semiconductor layer through the first contact hole; and
      a first drain electrode disposed on the insulation layer, and the first drain electrode contacting a part of the second part of the first oxide semiconductor layer through the second contact hole,
   a driving thin film transistor (TFT) including a second gate electrode is connected to the first drain electrode of the thin film transistor (TFT); and
   an organic light emitting diode (OLED) is connected to the driving thin film transistor (TFT),
   wherein the first contact hole of the insulation layer is disposed perpendicularly above the first end edge of the first gate electrode without the first source electrode making contact with a discrete portion of the insulation layer between the first contact hole and the second contact hole thereof, and the second contact hole of the insulation layer is disposed perpendicularly above the second end edge of the first gate electrode without the first drain electrode making contact with the discrete portion of the insulation layer between the first contact hole and the second contact hole thereof, and wherein the substrate is disposed horizontally and below the first gate electrode.

5. The organic light emitting diode (OLED) display of claim 4, wherein the driving thin film transistor (TFT) further comprises the second gate electrode disposed on the substrate and a second oxide semiconductor layer disposed on the second gate electrode, wherein the insulation layer further comprises a third contact hole that exposes a third part of the second oxide semiconductor layer corresponding to a first end of the second gate electrode and a fourth contact hole that exposes a fourth part of the second oxide semiconductor layer corresponding to a second end of the second gate electrode, and wherein the driving thin film transistor (TFT) further comprises a second source electrode disposed on the insulation layer and contacting the third part of the second oxide semiconductor layer through the third contact hole and a second drain electrode disposed on the insulation layer and contacting the fourth part of the second oxide semiconductor layer through the fourth contact hole.

6. The organic light emitting diode (OLED) display of claim 5, wherein the second source electrode covers the third contact hole.

7. The organic light emitting diode (OLED) display of claim 6, wherein the second drain electrode covers the fourth contact hole.

8. The organic light emitting diode (OLED) display of claim 5, wherein a first length between the first contact hole and the second contact hole is smaller than a second length between the third contact hole and the fourth contact hole.

9. The organic light emitting diode (OLED) display of claim 5, wherein the second drain electrode is connected to the organic light emitting diode (OLED).

10. An organic light emitting diode (OLED) including a thin film transistor (TFT), the TFT comprising:

a gate electrode disposed on a substrate;

an oxide semiconductor layer disposed on the gate electrode;

an insulation layer disposed on the oxide semiconductor layer, the insulation layer including a first contact hole that exposes a first part of the oxide semiconductor layer and is disposed vertically above a first end edge of the gate electrode and a second contact hole that exposes a second part of the oxide semiconductor layer and is disposed vertically above a second end edge of the gate electrode opposite to the first end edge of the gate electrode;

a source electrode disposed on the insulation layer, the source electrode contacting the first part of the first oxide semiconductor layer through the first contact hole; and a drain electrode disposed on the insulation layer, the drain electrode contacting the second part of the oxide semiconductor layer through the second contact hole, wherein the first contact hole of the insulation layer is disposed perpendicularly above the first end edge of the gate electrode without the source electrode making contact with a discrete portion of the insulation layer between the first contact hole and the second contact hole thereof, and the second contact hole of the insulation layer is disposed perpendicularly above the second end edge of the gate electrode without the drain electrode making contact with the discrete portion of the insulation layer between the first contact hole and the second contact hole thereof, and wherein the substrate is disposed horizontally and below the gate electrode.

11. The OLED of claim 10, wherein the first part of the oxide semiconductor layer is exposed by the first contact hole.

12. The OLED of claim 10, wherein the second part of the oxide semiconductor layer is exposed by the second contact hole.

13. The OLED of claim 10, further including a driving TFT.

14. The OLED of claim 13, wherein the driving TFT includes a driving TFT gate electrode connected to the drain electrode of the TFT, the driving TFT gate electrode is disposed on the substrate, and a driving TFT oxide semiconductor layer is disposed on the driving TFT gate electrode.

15. The OLED of claim 14, wherein the insulation layer further includes a third contact hole that exposes the driving TFT oxide semiconductor layer and a fourth contact hole that exposes the driving TFT oxide semiconductor layer.

16. The OLED of claim 15, wherein a first length between the first contact hole and the second contact hole is smaller than a second length between the third contact hole and the fourth contact hole.

17. The OLED of claim 14, wherein the driving TFT further comprises a driving TFT source electrode disposed on the insulation layer and contacting the driving TFT oxide semiconductor layer through the third contact hole and a driving TFT drain electrode is disposed on the insulation layer and contacting the driving TFT oxide semiconductor layer through the fourth contact hole.

18. The OLED of claim 17, wherein the driving TFT source electrode covers the third contact hole and the driving TFT drain electrode covers the fourth contact hole.

* * * * *